United States Patent [19]

Takada et al.

[11] Patent Number: 4,645,734
[45] Date of Patent: Feb. 24, 1987

[54] COMPOSITE HAVING CONDUCTIVE LAYER ON RESIN LAYER AND METHOD OF MANUFACTURING

[75] Inventors: Mitsuyuki Takada; Atsushi Endo; Hayato Takasago, all of Amagasaki, Japan

[73] Assignee: Mitsubishi Denki Kabushiki Kaisha, Tokyo, Japan

[21] Appl. No.: 726,588

[22] Filed: Apr. 23, 1985

[30] Foreign Application Priority Data

Aug. 10, 1984 [JP] Japan ................................. 59-168235

[51] Int. Cl.⁴ .............................................. G03C 5/00
[52] U.S. Cl. .................................... 430/315; 430/324; 430/328; 430/330; 427/307; 427/314
[58] Field of Search ............... 430/315, 324, 328, 330; 427/307, 308, 314, 316

[56] References Cited

U.S. PATENT DOCUMENTS 3,979,549  9/1976  Wilkinson .......................... 428/450
4,218,283  8/1980  Saiki et al. ......................... 156/656

FOREIGN PATENT DOCUMENTS 0056093  7/1982  Fed. Rep. of Germany .
2024442  1/1980  United Kingdom .

OTHER PUBLICATIONS

Photochemical Image Formation Process for High-Density Printed Circuit Patterns, Takahashi et al, Electrocomponent Sci. & Tech., 1981, vol. 8, Nos. 1 & 2, 99–102.

Primary Examiner—John E. Kittle
Assistant Examiner—Patrick J. Ryan
Attorney, Agent, or Firm—Lowe Price Leblanc Becker & Shur

[57] ABSTRACT

In manufacturing a composite having a conductive layer on the surface of a resin layer, the first resin layer of polyimide is formed on a substrate of alumina ceramic and, after a resin layer is thermally set by heating, a second resin layer of polyimide is then formed on the first resin layer and is dried. Then the surface of the second resin layer is subjected to selective photoetching by using a photomask having predetermined small opaque areas distributed, thereby to form unevenness including concaves formed as a result of the selective photoetching. The layered composite thus obtained is then heated so that the second resin layer is thermally set. Then catalyst nuclei are formed for electroless plating on the etched surface having the unevenness formed and then a conductive metallic layer is formed by an electroless plating process on the etched surface having the unevenness formed. As a result, a composite of the above described structure is provided.

9 Claims, 6 Drawing Figures

COMPOSITE HAVING CONDUCTIVE LAYER ON RESIN LAYER AND METHOD OF MANUFACTURING

BACKGROUND OF THE INVENTION

The present invention relates to a composite having a conductive layer on a resin layer and a method of manufacturing the same. More specifically, the present invention relates to improvements in a composite having a conductive layer formed through electroless plating on a resin layer and a method of manufacturing the same.

DESCRIPTION OF THE PRIOR ART

Conventionally known methods of manufacturing a composite having a conductive layer formed on a resin layer comprise a method of forming a metallic thin film on the surface of a resin layer utilizing a thin film forming technology such as evaporation, sputtering and the like, a method of forming a metallic layer on the surface of a resin layer by depositing catalyst nuclei for deposition of an electroless plated layer on the surface of the resin layer by immersing the same in an electroless plating bath, and the like. The conductive layer thus formed through such a thin film forming technology is as thick as several μm at the largest. Accordingly, in using the conductive layer as a conductor of a circuit board, the impedance cannot be made small due to a small thickness thereof. In addition, generally a thin film forming process is disadvantageous in terms of productivity and cost as compared with other film forming processes, such as a thick film forming process. Therefore, the thin film forming process has been merely utilized in the field where fine patterns are required, such as in manufacture of electronic devices such as circuit boards, magnetic heads and the like for use in industrial electronic machines.

Typical applications of formation of a conductive layer by electroless plating are plating of a conductive layer onto a through hole of a printed circuit board of a resin material, and the like. Other applications of electroless plating comprise a well-known full additive method for forming a circuit by forming a conductive layer of a thickness larger than 10 μm by electroless plating only on desired portions of a circuit board, and the like. In forming a conductive layer on a resin layer by electroless plating, the surface of the resin layer is processed to make uneven in order to enhance adhesion of the conductive layer onto the surface of the resin layer. Known methods for making uneven the surface of the resin layers comprise a method of making uneven the surface in a mechanical manner, and a method of making uneven the surface through etching by chemicals, plasma and the like. However, the mechanical method involves less uniformity in an uneven state of the surface and the degree of unevenness is relatively large, with the result that the adhesion of a conductive layer to the surface of the resin layer is diversified particularly in case of a fine pattern of the conductive layer. On the other hand, the etching method by chemicals or plasma involves a disadvantage that productivity is poor and the degree of unevenness is small.

SUMMARY OF THE INVENTION

Accordingly, a principal object of the present invention is to provide a composite having a conductive layer of an increased thickness on the surface of a resin layer with an increased adhesion of the conductive layer to the resin layer, which can be manufactured with excellent productivity.

Briefly described, the present invention comprises a composite having a conductive layer on the surface of a resin layer, which comprises a substrate, a resin layer formed on the main surface of the substrate and comprising a resin material which is selectively photoetchable at predetermined small areas distributed on the main surface as a function of a photomask having corresponding photo patterns and being settable after selective photoetching, the resin layer having unevenness including concavities formed on the main surface of the resin layer as a result of selective photoetching of the resin layer and having been set after the selective photoetching thereof, and a conductive metallic layer formed on the main surface and inside the concavities of the resin layer through electroless plating.

In manufacturing such composite, first the resin layer is formed on the substrate and the resin material of the surface of the resin layer is selectively photoetched at predetermined small areas distributed on the main surface using a photomask having corresponding photo patterns, thereby to form unevenness including concavities formed as a result of the selective photoetching of the resin material, and then the resin material of the resin layer having unevenness formed on the main surface of the resin layer is set. Then catalyst nuclei are formed for electroless plating on the selectively photoetched surface having unevenness and then a conductive metallic layer is formed by an electroless plating process on the selectively photoetched surface having unevenness. As a result, a composite of the above described structure is provided.

In accordance with an embodiment of the present invention, the resin material comprises a thermo-setting material being thermo-settable at a predetermined thermo-setting temperature, wherein the resin material is selectively photoetchable at predetermined small areas distributed on the main surface of the resin layer when the resin material has not been thermo-set, and the resin material is heated to the predetermined thermo-setting temperature after the resin material of the surface of the resin layer is selectively photoetched and before the catalyst nuclei for electroless plating are formed. Such thermo-setting resin material may comprise polyimide resin or polyamide carboxylic acid varnish.

In a preferred embodiment of the present invention, a further resin layer may be included between the above described resin layer and the substrate, which is of the same material and is set in advance.

In a further preferred embodiment of the present invention, the substrate may be made of alumina ceramic or epoxy glass. A photomask for use in the present invention may comprise a transparent film having a distribution of predetermined small areas in association with concavities to be formed on the surface of the resin layer.

According to the present invention, the surface of the resin layer is formed with unevenness by a selective photoetching process using a photomask having a distribution of predetermined small areas and such process can be done with an excellent productivity as compared with a conventional process. In addition, uniform unevenness can be formed by controlling the unevenness conditions of the resin layer by changing the photo patterns of a photomask, development and exposure conditions and the like and hence the adhesion of the conductive layer onto the resin layer can be enhanced and as a result a composite having a conductive layer of an increased thickness on a resin layer can be manufactured with excellent productivity.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Now one embodiment of the present invention will be described with reference to the drawings.

Figure 1:
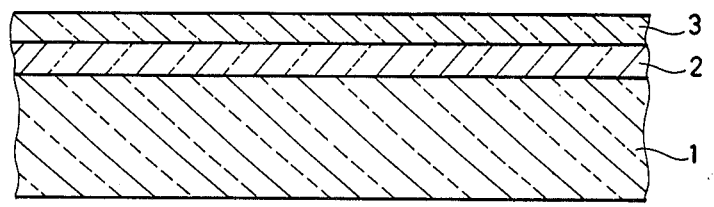
FIGS. 1, 3 and 4 are sectional views of a composite at various steps of a manufacturing process in accordance with one embodiment of the present invention.
Figure 2:
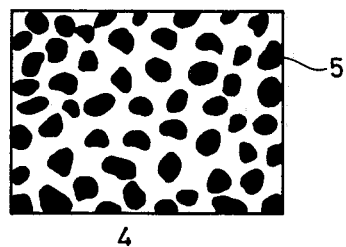
FIG. 2 is a plan view of a photomask for use in the above described one embodiment of the present invention.
Figure 3:
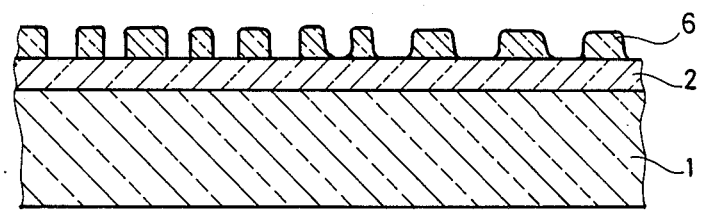
Figure 4:
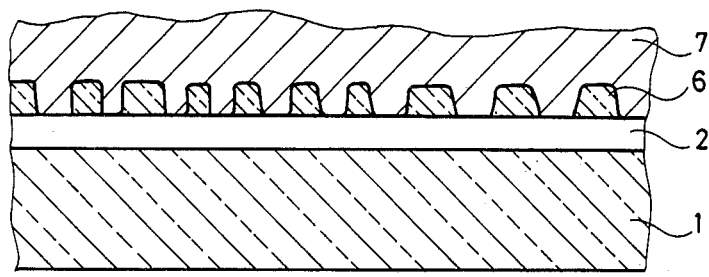

FIG. 1 is a sectional view of a composite having a first resin layer of a liquid resin having photosensitivity coated on a substrate, dried and set, and a second resin layer of the same liquid resin material coated and dried. FIG. 2 is an enlarged view of a photomask having a distribution of fine opaque areas in a distribution of fine transparent portions. FIG. 3 is a sectional view of the composite having unevenness including concavities formed by exposing, developing and setting the photosensitive resin material of the surface of the resin layer. FIG. 4 is a sectional view of the composite having a conductive metallic layer formed by an electroless plating process.

Referring to the figures, the reference numeral 1 denotes a substrate, which comprises an alumina ceramic substrate, the reference numeral 2 denotes the first resin layer of a resin material coated on the alumina ceramic substrate 1 and dried and set, which may be of polyimide resin, the reference numeral 3 denotes the second resin layer of a resin material having photosensitivity, coated on the first resin layer 2 and dried, which may be of photosensitive polyimide precursor, the reference numeral 4 denotes a photomask having a mixed distribution of fine transparent areas and fine opaque areas both of about the same size, the reference numeral 5 denotes opaque areas formed in the photomask 4, the reference numeral 6 denotes the second resin layer having unevenness including concavities formed by exposing, developing and setting the second resin layer of photosensitive polyimide precursor, and the reference numeral 7 denotes a conductive metallic layer formed through electroless plating, which may be of nickel.

Now referring to FIGS. 1 to 4, a method of manufacturing a composite having a conductive layer on the surface of a resin layer in accordance with the first embodiment of the present invention will be described. First a resin material of photosensitive polyimide precursor (such as "Photoneece" (trademark) manufactured by Toray Industries Incorporated) is coated on an alumina ceramic substrate 1, and after the same is dried at the temperature of 80° C. for thirty minutes, the same is heated at the temperature of 350° C. in the atmosphere of nitrogen for one hour, so that the resin material is thermally set to provide a resin layer of polyimide resin. Then a resin material of photosensitive polyimide precursor is similarly coated on the first resin layer 2 of polyimide resin and is dried at the temperature of 80° C. for thirty minutes. Then the composite is exposed to light using the photomask 4.

The photomask 4 is formed of a distribution of fine opaque areas 5 in a transparent background, as shown in FIG. 2. Such photomask 4 is prepared by attaching carbon granules on a transparent plastic film. Such photomask is readily attained by photocopying a distribution of fine black dots on a transparent plastic film using a xerographic photocopying machine, for example, such that the opaque areas 5 may be as large as 20 μm.

The photomask 4 thus obtained is used for exposure to light of the second resin layer 2 of photosensitive polyimide precursor 3. The exposure conditions are selected such that the light from a 250-W very high voltage mercury lamp is supplied for 60 sec. when "Toray Photoneece" is employed as a photosensitive resin precursor for the second resin layer. Then the development process is selected such that a mixture solution of n-methyl-2-pyrrolidone and methanol (n-methyl-2-pyrrolidone/methanol=7/3) is warmed to 23° C. and the above described composite is immersed therein for 90 sec., whereby the photosensitive resin precursor of the second resin layer 3 of the portion (corresponding to the opaque areas 5 in the photomask 4) not exposed to light in the exposure process is removed, and then the composite is heated to the temperature of 350° C. for an hour at the atmosphere of nitrogen, so that the polyimide precursor of the second layer 3 as left in the pattern of the opaque areas is changed to polyimide, with the result that a resin layer having the unevenness as shown in FIG. 3 is provided.

Then catalyst nuclei, not shown, are deposited for electroless plating on the surface of the resin layer 3 having the unevenness formed. Then the same is immersed in an electroless plating bath, in this case an electroless plating nickel bath, so that a conductive layer 7 is formed on the surface of the resin layer 3.

With such composite, a contact surface between the resin layer 3 and the conductive layer 7 is increased, which serves to provide a mechanical anchoring effect, and adhesion of the conductive layer to the resin layer is enhanced. The unevenness conditions of the surface of the resin layer for allowing an increased thickness of the conductive layer can be controlled by changing the development and exposure conditions and the depth of the unevenness can be increased at the most to be commensurate with the thickness of the second resin layer 3, which means that the degree of the unevenness can be made large as compared with in case of other methods.

In the above described embodiment, a photomask was implemented by forming carbon granules on a transparent plastic film. However, such photomask may be of any type having transparent areas and opaque areas mixedly formed, as selected depending on the degree of required unevenness and such degree of unevenness can be readily controlled. For example, the geometry of opaque areas (corresponding to concave portions in case of "Photoneece" of Toray) may be those of a rectangle, a circle or a polygon regularly disposed.

Enhancement of the adhesion of the conductive layer to the resin layer decreases any possibility of peeling off when the thickness of the conductive layer is increased, thereby to make it possible to form a conductive layer in an increased thickness by electroless plating, or to additionally form a further electroplated layer on an electroless plated layer to increase the thickness of the conductive layer.

Figure 5:
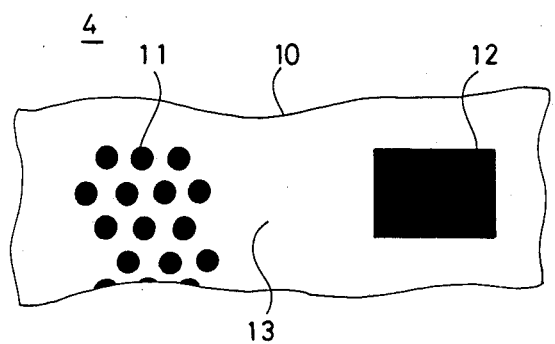
FIG. 5 is a plan view of a photomask for use in another embodiment of the present invention.
Figure 6:
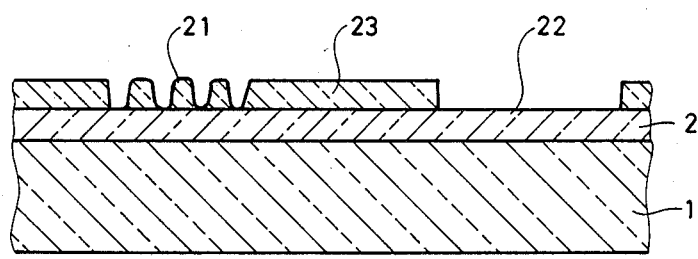
FIG. 6 is a sectional view of a composite at a step of a manufacturing process using the photomask shown in FIG. 5.

Now another embodiment of the present invention will be described with reference to FIGS. 5 and 6. FIG. 5 is a plan view of a photomask for use in the other embodiment, and FIG. 6 is a sectional view of a composite having a resin layer formed in accordance with the embodiment shown in FIG. 5.

Referring to figures, the reference numeral 10 denotes a photomask, the reference numeral 11 denotes opaque areas of a circular form, the reference numeral 12 denotes an opaque area of a relatively large area, the reference numeral 13 denotes a background transparent area having no opaque area formed, and the reference numerals 21, 22 and 23 denote those portions of a resin material formed corresponding to the opaque areas 11 and 12 and the transparent area 13 of the photomask 10.

By applying the same process as the previously described embodiment using the photomask shown in FIG. 5, only desired portion of the resin layer 3 is made uneven and at the same time a predetermined concave pattern can be simultaneously formed as shown as the portion 22.

By leaving catalyst nuclei only in the portion having unevenness formed depending on the difference in the degree of the unevenness of the surface after water washing or acid rinsing in the step of forming catalyst nuclei for electroless plating and by applying an electroless plating process, even a conductive layer can be formed in a predetermined pattern and, as a result, formation of a circuit board by an additive method can be made.

In case where through holes are formed in the resin layer, by forming through holes slightly larger than through holes formed in the first (lower) resin layer, while the wall surface of the through holes is inclined, it is possible to simultaneously prevent inconveniences of such as discontinuation of the conductive layer at an offset portion formed at the process to be done later.

An advantage is brought about that in case where the conductive layer is formed with the same sandwiched between the resin layers, an electrostatic capacitance between the conductors can be controlled by forming the resin layer in a proper pattern.

In the above described embodiment, the resin layer was formed of the first and the second resin layers 2 and 3, both of a photosensitive polyimide precursor. However, it is not necessarily required that the first layer has photosensitivity and the same may be of polyamide carboxylic varnish.

The foregoing embodiment was also described about a case where the substrate is made of an alumina ceramic substrate. However, the substrate is sufficient to be a material stable at a thermo-setting temperature of the resin material being used and the same may be a glass epoxy substrate, for example.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a composite having a conductive layer on the surface of a resin layer, comprising the steps of
    preparing a substrate having a main surface,
    forming on said main surface of said substrate a resin layer comprising a resin material, said resin material being selectively photoetchable at predetermined small areas distributed on said main surface and being settable after selective photoetching,
    selectively photoetching said resin material on the surface of said resin layer at predetermined small areas distributed on said main surface with a photomask having corresponding photo patterns, to form unevenness including concavities formed as a result of said selective photoetching of said resin material,
    setting said resin material of said resin layer having said unevenness formed on said main surface of said resin layer,
    forming catalyst nuclei for electroless plating on said selectively photoetched surface having said unevenness of said resin layer, and
    electroless plating a conductive metallic layer on said selectively photoetched surface having said unevenness having said catalyst nuclei formed.

2. A method of manufacturing a composite in accordance with claim 1, which further comprises the step of
    forming between said first mentioned resin layer and said main surface of said substrate a further resin layer comprising a resin material being non-etchable.

3. A method of manufacturing a composite in accordance with claim 1, wherein
    said resin material of said resin layer comprises a thermo-setting material being thermo-settable at a predetermined thermo-setting temperature, said resin material being selectively photoetchable at predetermined small areas distributed on said main surface when said resin material has not been thermo-set, and which further comprises the step of
    heating said resin material to said predetermined thermo-setting temperature after said step of selectively photoetching said resin material of the surface of said resin layer.

4. A method of manufacturing a composite in accordance with claim 3, which further comprises the step of
    forming between said first mentioned resin layer and said main surface of said substrate a further resin layer comprising a resin material being non-etchable,
    said resin material of said further resin layer comprising a thermo-setting material being thermo-settable at a predetermined thermo-setting temperature, and
    heating said resin material of said further resin layer to said predetermined thermo-setting temperature before said step of forming said first mentioned resin layer.

5. A method of manufacturing a composite in accordance with claim 1, wherein said resin material of said resin layer comprises polyimide.

6. A method of manufacturing a composite in accordance with claim 2, wherein said resin materials of said first mentioned resin layer and said further resin layer comprise polyimide.

7. A method of manufacturing a composite in accordance with claim 1, wherein
    said substrate comprises alumina ceramic.

8. The method of claim 1, wherein the degree of unevenness of the surface of said photoetchable resin is controlled by varying the development and exposure conditions during the photoetching step.

9. The method of claim 1, wherein said photomask is produced by attaching carbon granules on a transparent plastic film.

* * * * *